United States Patent
Yokoyama et al.

(10) Patent No.: US 8,884,933 B2
(45) Date of Patent: *Nov. 11, 2014

(54) INPUT DEVICE

(75) Inventors: Tatsuya Yokoyama, Miyagi-ken (JP); Anthony McCurdy, Miyagi-ken (JP); Shinya Urayama, Miyagi-ken (JP); Yu Igarashi, Miyagi-ken (JP); Shunsuke Nakazawa, Miyagi-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 198 days.

This patent is subject to a terminal disclaimer.

(21) Appl. No.: 13/439,408

(22) Filed: Apr. 4, 2012

(65) Prior Publication Data

US 2012/0262393 A1    Oct. 18, 2012

(30) Foreign Application Priority Data

Apr. 14, 2011 (JP) .................................. 2011-089776

(51) Int. Cl.
*G06F 3/041* (2006.01)
*G06F 3/0354* (2013.01)
*H01H 25/06* (2006.01)
*G06F 3/0362* (2013.01)

(52) U.S. Cl.
CPC ........... *G06F 3/03547* (2013.01); *H01H 25/06* (2013.01); *G06F 3/0362* (2013.01)
USPC ........... 345/184; 345/161; 345/167; 345/173; 345/174; 200/4; 200/179; 200/564

(58) Field of Classification Search
USPC ......... 345/156–157, 161, 172–174, 184, 167; 200/564, 4, 5 R, 6 A, 179
See application file for complete search history.

(56) References Cited

U.S. PATENT DOCUMENTS

| | | | | |
|---|---|---|---|---|
| 5,613,600 A | * | 3/1997 | Yokoji et al. | 200/564 |
| 7,368,673 B2 | * | 5/2008 | Sato | 200/5 R |
| 7,579,559 B2 | * | 8/2009 | Schelbert et al. | 200/4 |
| 7,965,282 B2 | * | 6/2011 | Yamada | 345/184 |
| 2004/0074333 A1 | * | 4/2004 | Kasahara | 74/553 |
| 2006/0012584 A1 | * | 1/2006 | Vassallo et al. | 345/184 |
| 2006/0283286 A1 | * | 12/2006 | Maeda et al. | 74/553 |
| 2009/0008233 A1 | * | 1/2009 | Saomoto | 200/6 A |
| 2010/0073291 A1 | * | 3/2010 | Hisatsugu et al. | 345/161 |

FOREIGN PATENT DOCUMENTS

WO    WO 2010/000281    1/2010

* cited by examiner

*Primary Examiner* — Lun-Yi Lao
*Assistant Examiner* — Elliott Deaderick
(74) *Attorney, Agent, or Firm* — Hunton & Williams LLP

(57) ABSTRACT

A support body holding a touch pad is mounted on a hollow support body of a base member, a space is formed in the base member and extends from its inside to an inside of the hollow support body, a shaft is provided vertically to an operation knob and extends from a back surface of a top surface portion, the touch pad has a through hole through which the shaft is inserted into the space, a rotation detection portion detecting rotating movement of an operation body and a pressing detection portion detecting reciprocating movement of the operation body are provided, and, in the space, the shaft is linked to a rotating movement portion making rotation detection movement for the rotation detection portion with rotating movement of the operation body and a pressing movement portion making pressing detection movement for the pressing detection portion with reciprocating movement of the operation body.

4 Claims, 5 Drawing Sheets

INPUT DEVICE

CLAIM OF PRIORITY

This application includes subject matter related to and claims the benefit of Japanese Patent Application No. 2011-089776 filed on Apr. 14, 2011, the contents of which is incorporated herein by reference.

BACKGROUND OF THE DISCLOSURE

1. Field of the Disclosure

The present disclosure relates to an input device having at least an operation body on which a rotation operation is capable of being performed, and specifically relates to an input device including a touch pad which is provided on a back surface side of an operation body and detects approach or contact of a finger.

2. Description of the Related Art

As an input device provided in a center console of a vehicle or the like, an input device is known which includes an operation body freely rotated and reciprocated relative to a base member, in which the operation body includes an operation knob formed in a cylindrical shape having a top surface portion, in which a touch pad for detecting approach or contact of a finger with respect to the top surface portion is provided on a back surface side of the top surface portion constituting the operation knob, and in which an input is made by approach or contact of a finger with respect to the top surface portion of the operation knob as well as a rotation operation and a pressing operation of the operation body. Such an input device is, for example, an input device disclosed in International Publication No. 2010/000281.

In an input device having a touch pad, it is necessary to provide a support body which supports the touch pad. In an existing input device, a support body is provided within a base member, a wire to the touch pad is located therein, and a detection portion for detecting a rotation operation and a pressing operation of an operation body is located on a peripheral portion of the support body. Thus, a space for locating the detection portion needs to be ensured outward in the radial direction of the input device, and this inhibits size reduction of the input device.

These and other drawbacks exist.

SUMMARY OF THE DISCLOSURE

The present disclosure provides an input device which can be reduced in size in a radial direction thereof while including a touch pad and an operation body on which a rotation operation and a pressing operation are capable of being performed.

In order to solve the problem described above, the present disclosure provides an input device including: a base member including a hollow support body; and an operation body supported so as to freely rotate relative to the hollow support body and freely reciprocate along a direction of a rotational axis. The operation body includes an operation knob formed in a cylindrical shape and having a top surface portion and a plate-shaped touch pad provided on a back side of the top surface portion for detecting approach or contact of a finger with respect to the top surface portion. The base member has a space formed so as to extend from an inside of the base member to an inside of the hollow support body. The operation knob has a shaft provided vertically so as to extend from a back surface of the top surface portion. The touch pad has a through hole through which the shaft is inserted into the space. A rotation detection portion for detecting a rotating movement of the operation body and a pressing detection portion for detecting a reciprocating movement of the operation body are provided. In the space, the shaft is linked to a rotating movement portion which makes a rotation detection movement for the rotation detection portion with a rotating movement of the operation body, and to a pressing movement portion which makes a pressing detection movement for the pressing detection portion with a reciprocating movement of the operation body.

Further, an interlocking shaft is located in the space and connected to the shaft, and the rotating movement portion and the pressing movement portion are provided in the interlocking shaft.

Further, the shaft and the interlocking shaft are connected to each other through a cam portion having a plurality of cam surfaces formed along a peripheral surface thereof, and an elastic portion is provided in the hollow support body and engages with and disengages from the cam surfaces with a rotating movement of the operation body.

Further, the rotation detection portion and the pressing detection portion are located so as to face the space.

Further, the operation body has a support body which rotationally supports the operation knob, and the support body is supported by the hollow support body so as to reciprocate along a direction of a rotational axis of the operation knob.

Further, the support body and the operation knob are allowed to freely rotate along a peripheral surface of the support body by a bearing portion which includes an inner ring portion fixed to the support body and an outer ring portion fixed to the operation knob, and the inner ring portion and the outer ring portion freely rotate relative to each other.

According to various embodiments, the operation knob has the shaft provided vertically so as to extend from the back surface of the top surface portion, the touch pad has the through hole through which the shaft is inserted into the space, and in the space, the shaft is linked to the rotating movement portion which makes a rotation detection movement for the rotation detection portion with a rotating movement of the operation body, and to the pressing movement portion which makes a pressing detection movement for the pressing detection portion with a reciprocating movement of the operation body. Thus, parts required to detect a rotation operation and a pressing operation of the operation body can be located in a space below the capacitance type touch pad provided on the back side of the top surface portion of the operation knob, namely, in the space which extends from the inside of the base member to the inside of the support body, and it is unnecessary to locate the parts widely in the radial direction. Thus, size reduction in the radial direction can be achieved.

Additionally, the interlocking shaft is located in the space and connected to the shaft, and the rotating movement portion and the pressing movement portion are provided in the interlocking shaft. Thus, the shaft and the interlocking shaft can be connected to each other with a simple structure, and the shaft can be linked to the rotating movement portion and the pressing movement portion with a simple configuration.

Further, the shaft and the interlocking shaft are connected to each other through the cam portion having the plurality of cam surfaces formed along the peripheral surface thereof, and the elastic portion is provided in the hollow support body and engages with and disengages from the cam surfaces with a rotating movement of the operation body. Thus, a click mechanism can be made compact and provide a smooth click feel, and a connection member between the shaft and the interlocking shaft is configured to serve as the click mechanism. Thus, the entire device can be further reduced in size.

Further, the rotation detection portion and the pressing detection portion are located so as to face the space from the outside of the space. Thus, a space for locating parts can be effectively used, and size reduction can be achieved.

Then, according to various embodiments, the operation body includes the support body which rotationally supports the operation knob, and the support body is supported by the hollow support body so as to reciprocate along the direction of the rotational axis of the operation knob. Thus, the click mechanism can be provided at a position different from a rotation support portion for the operation knob. Thus, it is unnecessary to receive a rotation load at the shaft, and hence the shaft can be formed with a small diameter and the through hole formed in the touch pad can be made small.

Further, the support body and the operation knob are allowed to freely rotate along the peripheral surface of the support body by the bearing portion which includes the inner ring portion fixed to the support body and the outer ring portion fixed to the operation knob, and the inner ring portion and the outer ring portion freely rotate relative to each other. Thus, a smooth operation can assuredly be performed without backlash of the operation knob.

DETAILED DESCRIPTION OF THE DISCLOSURE

The following description is intended to convey a thorough understanding of the embodiments described by providing a number of specific embodiments and details involving an input device. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
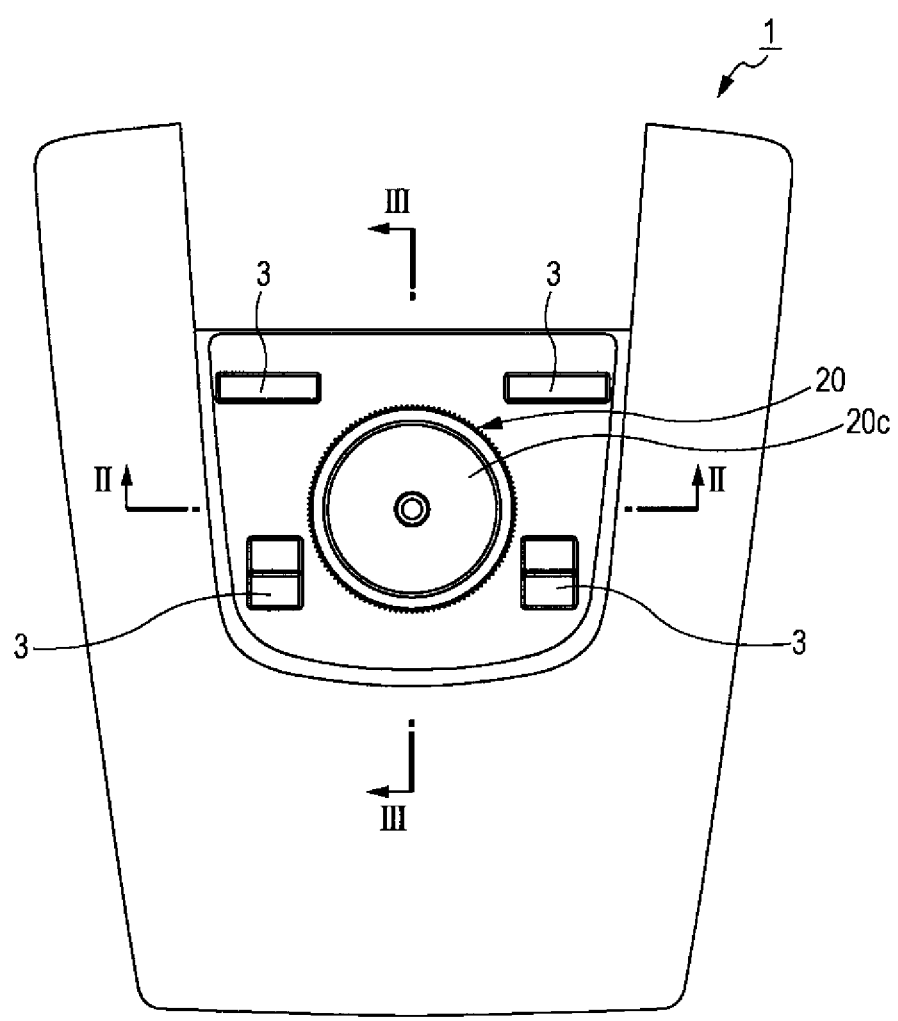
FIG. 1 is a front view of a center console including an input device according to an embodiment of the disclosure.

FIG. 1 shows a front view of a center console 1 which may include an input device 2. The center console 1 may be located between a driver seat and a passenger seat of a vehicle, for example. The input device 2 and switches 3 through which various inputs are made may be located on a surface of the center console 1.

Figure 4:
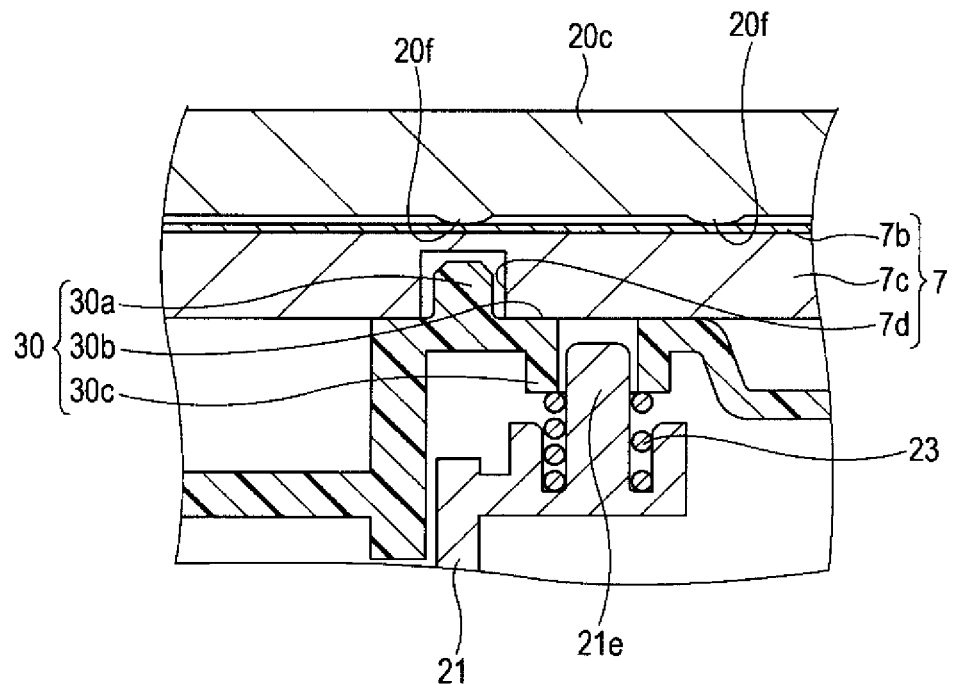
FIG. 4 is an enlarged cross-sectional view of a portion of a capacitance type touch pad in FIG. 2.

The input device 2 may include an operation knob 20 which may have a cylindrical shape with a bottom, may be exposed in the vehicle interior, can be rotated along a circumferential direction thereof, and can be pressed in a direction perpendicular to the surface of the center console 1; and a plate-shaped capacitance type touch pad 7 (hereinafter, referred to merely as touch pad; FIG. 4) which may be provided on the back side of the top surface portion 20c and can detect approach or contact of a finger with respect to a surface of a top surface portion 20c of the operation knob 20.

Figure 2:
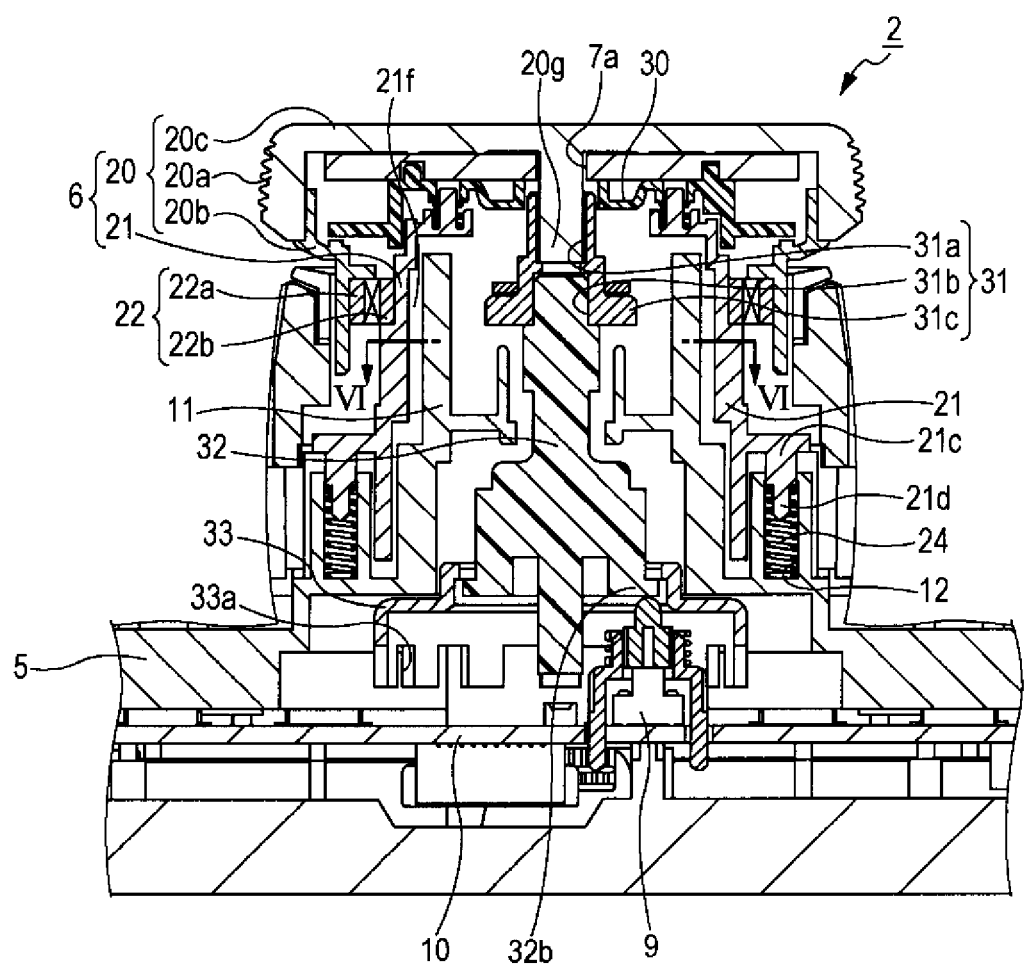
FIG. 2 is a cross-sectional view taken along the II-II line in FIG. 1.
Figure 3:
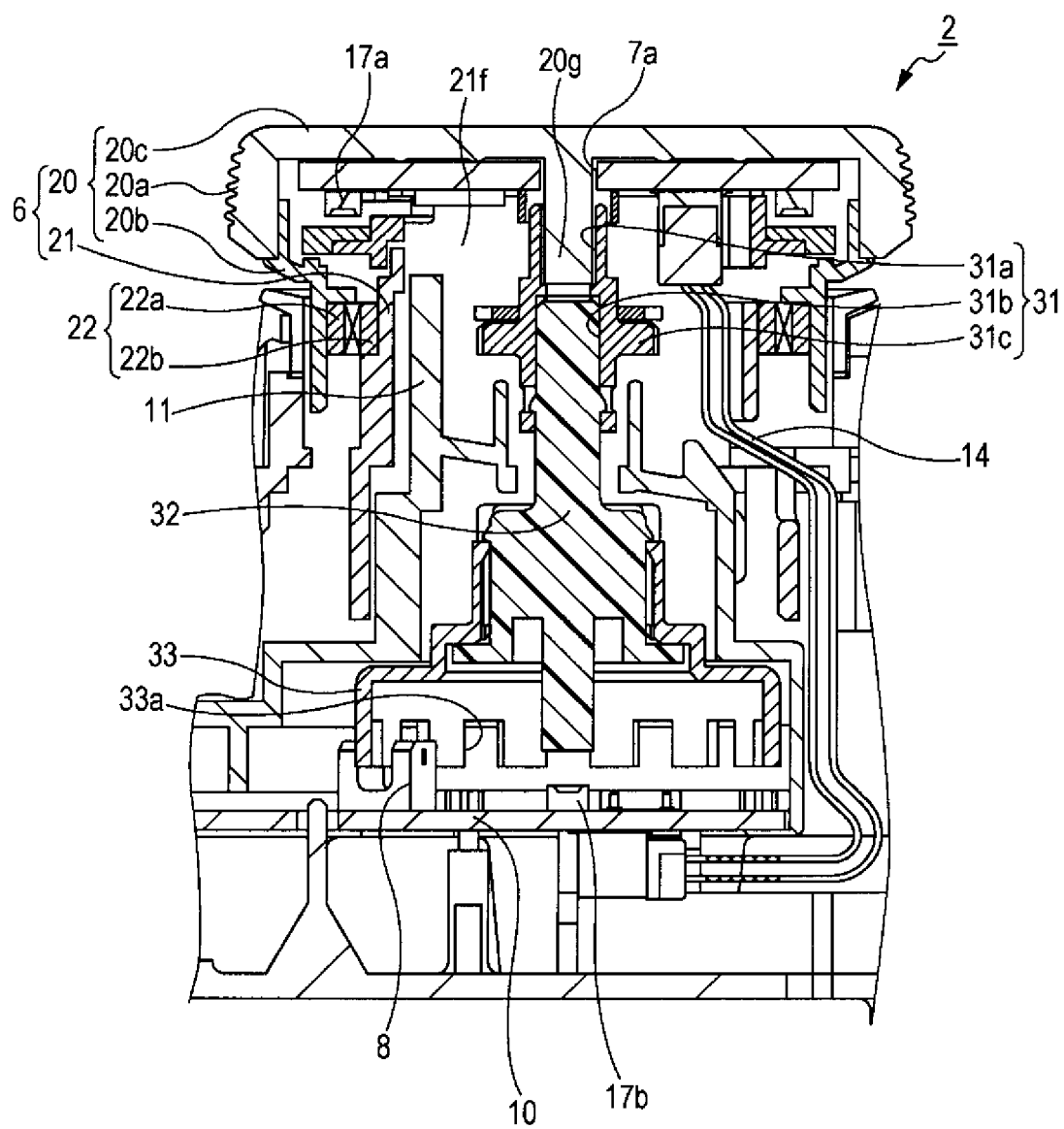
FIG. 3 is a cross-sectional view taken along the III-III line in FIG. 1.

FIG. 2 shows an enlarged cross-sectional view taken along the II-II line in FIG. 1 around the input device 2, and FIG. 3 shows an enlarged cross-sectional view taken along the III-III line in FIG. 1 around the input device 2. The input device 2 may be configured such that an operation body 6 may be mounted on a hollow support body 11 provided vertically so as to extend upright from a hollow base member 5 placed on a base plate 10, such that the operation body 6 may rotate freely and reciprocate freely in the vertical direction in FIG. 2 (in the direction of the rotational axis) as described above. In a region of the base plate 10 which may face the inner space of the base member 5, a rotation detection portion 8 (FIG. 3) which may detect a rotating movement of the operation body 6 and a pressing detection portion 9 (FIG. 2) which may detect a reciprocating movement of the operation body 6 may be located. The internal space described above may correspond to a space 21f described later and may extend from the inside of the base member 5 to the inside of the hollow support body 11. The rotation detection portion 8 may be configured as a photointerrupter which may include a light-receiving element and a light-emitting element which may face each other across a lower end side (a side on which a slit 33a is formed) of a cylindrical code plate 33 mounted on an interlocking shaft 32, and the pressing detection portion 9 may be configured as a pressing switch.

The operation body 6 may include the operation knob 20 formed in a cylindrical shape having the top surface portion 20c, and a hollow cylindrical support body 21 which may rotationally hold the operation knob 20 through a bearing portion 22. Meanwhile, the support body 21 may freely reciprocate relative to the hollow support body 11 (the base member 5) together with the operation knob 20 in the vertical direction in the drawing (in the direction of the rotational axis). Thus, since the operation knob 20 may freely rotate relative to the support body 21 only along the circumferential direction thereof, the operation knob 20 may freely rotate relative to the base member 5.

Figure 6:
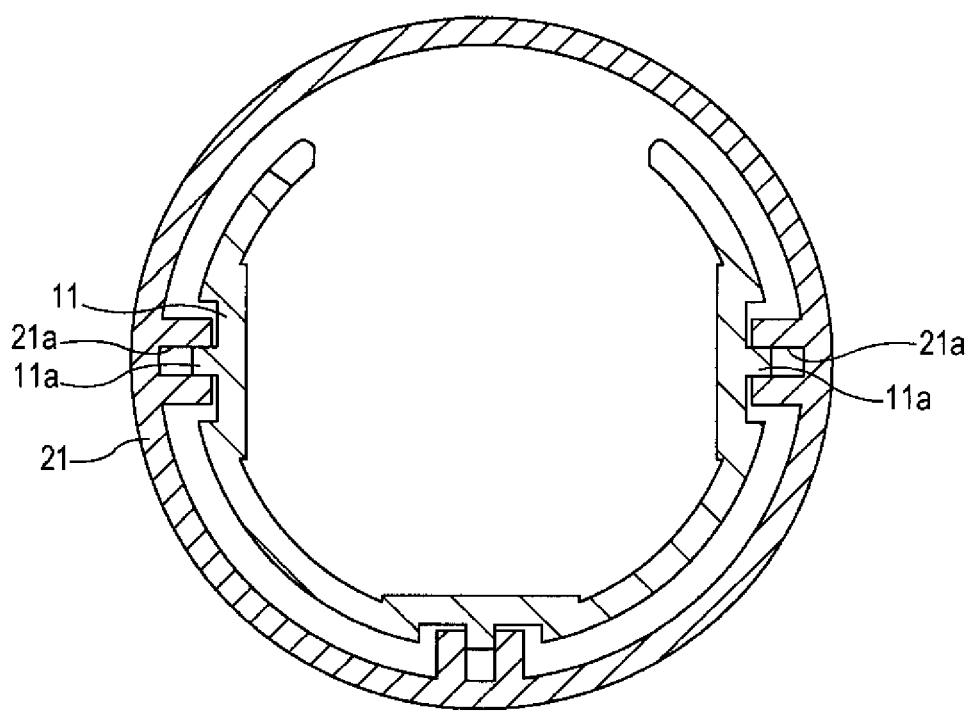
FIG. 6 is a schematic cross-sectional view of a portion along the VI-VI line in FIG. 2.

FIG. 6 shows a schematic cross-sectional view of a relevant portion along the VI-VI line in FIG. 2. As shown in FIG. 6, the support body 21 may have, in an inner peripheral surface (inner wall) thereof, a plurality of grooves (recesses) 21a extending in the vertical direction, and the hollow support body 11 provided vertically on the base member 5 may have, in an outer peripheral surface (outer wall) thereof, a guide rail (projection) 11a which may engage with each groove 21a so as to be guided by the groove 21a. Due to this configuration, the support body 21 may be assuredly and stably supported so as to freely reciprocate relative to the hollow support body 11 (the base member 5) together with the operation knob 20 in the vertical direction in the drawing. The grooves 21a may be formed in the outer wall of the hollow support body 11 and the guide rails 11a may be formed in the inner wall of the support body 21. The hollow support body 11 may serve as an operation body support portion, namely, may serve to support the operation body 6 such that the operation body 6 may freely reciprocate only in the vertical direction, and thus may be formed in a hollow cylindrical shape. The support body 21 may have a space having a polygonal transverse cross section, and the hollow support body 11 may have an outer shape corresponding to the space shape of the support body 21.

On the base member 5, the hollow support body 11 may be formed in such a position that the operation body 6 may freely rotate and freely reciprocate in the vertical direction. The hollow support body 11 may be formed so as to have a step in a peripheral surface thereof, and the support body 21 may be provided outside the hollow support body 11 so as to cover its peripheral surface. The support body 21 may have a hollow cylindrical shape, and thus may have the space 21f formed therein.

As shown in FIG. 2, an accommodation portion 12 may be formed outside a base end portion of the hollow support body 11 on the base member 5 so as to have a recess shape and so as to extend in the circumferential direction over 180 degrees. A lower end projection 21c may be formed in a lower end portion of the support body 21 and accommodated in the accommodation portion 12. The lower end projection 21c may be moveable vertically within the accommodation portion 12. In addition, a lower elastic body holding portion 21d may be formed in a lower end portion of the lower end projection 21c and may hold a pressing elastic body 24 which may be formed by a coil spring as an elastic body. When the support body 21 moves downwardly, the pressing elastic body 24 may generate a repelling force against the movement.

As described above, the support body 21 may be allowed to freely move vertically relative to the base member 5 due to the accommodation portion 12 and may be supported by the base member 5 through the pressing elastic body 24. Thus, the support body 21 can make a reciprocating movement in which the support body 21 may move downwardly relative to the base member 5 by pressing the operation body 6, and when the pressing is released, the support body 21 may return to the original position by the repelling force of the pressing elastic body 24.

The operation knob 20 may be composed of an upper member 20a having the top surface portion 20c, and a lower member 20b which may be fixed to a lower portion of the upper member 20a and may be inserted in the base member 5.

The lower member 20b of the operation knob 20 may have a diameter larger than the outer diameter of the support body 21 and may face the outer peripheral surface of the support body 21. The bearing portion 22, which may allow the operation knob 20 to freely rotate relative to the support body 21, may be formed from a ring-shaped bearing member and may be configured such that an outer ring portion 22a and an inner ring portion 22b freely rotate relative to each other. Specifically, a rolling bearing, a plain bearing, a magnetic bearing, a fluid dynamic bearing, or the like can be used.

The outer ring portion 22a of the bearing portion 22 may be fixed at its outer peripheral surface to the inner surface side of the operation knob 20 (the lower member 20b), and the inner ring portion 22b of the bearing portion 22 may be fixed at its inner peripheral surface to the outer surface side of the support body 21. Thus, the operation knob 20 may be supported so as to freely rotate relative to the support body 21 in the circumferential direction thereof.

As described above, the operation body 6 may be composed of the support body 21 and the operation knob 20, the support body 21 may be configured to be supported by the base member 5 through the pressing elastic body 24 and to freely reciprocate vertically along the hollow support body 11, and the operation knob 20 may be configured to freely rotate relative to the support body 21 through the bearing portion 22, thereby providing a structure in which the operation knob 20 is mounted on the support body 21 so as to freely rotate relative to the support body 21 which reciprocates relative to the base member 5. Thus, in the input device of the present embodiment, the reciprocating movement and the rotation operation of the operation knob 20 can assuredly be performed in different configurations, respectively, unlike the case where these operations are performed through the gap between a hollow cylindrical bearing portion and a cylindrical operation body (operation shaft) provided around the bearing portion as in the related art, and hence a smooth operation is possible without backlash.

FIG. 4 shows an enlarged view around the touch pad 7 in FIG. 2. In an upper end portion of the support body 21, an upper elastic body holding portion 21e may be formed in a projection shape and may hold a support elastic body 23 formed by a coil spring. As described in detail later, the support body 21 may support the touch pad 7 through the support elastic body 23 so as to press the touch pad 7 against the inner surface of the top surface portion 20c. It should be noted that if a configuration is provided in which the top surface portion 20c is not illuminated by a light emitter 17a, a reflector 30 may not be interposed and the upper elastic body holding portion 21e may be pressed directly against the touch pad 7.

In the touch pad 7, a film substrate 7b in which a drive electrode and a detection electrode, which are not shown, may be arranged on one surface is attached to a circuit board 7c to be formed in a plate shape, and the ring-shaped reflector 30 formed from a synthetic resin may be mounted on the lower surface side. In the reflector 30, a contact portion 30b may be formed in contact with the lower surface of the touch pad 7, an engagement projection 30a may be formed on the contact portion 30b so as to project toward the top surface portion 20c, a cylindrical projection 30c may be formed on the contact portion 30b so as to project in the downward direction in the drawing, and a reflecting layer (not shown) may be formed on a side facing the touch pad 7. The engagement projection 30a may be engaged with an engaged hole 7d formed in the lower surface of the touch pad 7, whereby the touch pad 7 and the reflector 30 may be integrated. As shown in FIG. 4, the end portion of the upper elastic body holding portion 21e may be fitted into a hollow portion of the cylindrical projection 30c, and the support elastic body 23 may be supported in a compressed state. As shown in FIG. 3, the light emitter 17a formed by a light emitting diode (LED), for example, may be provided on the lower surface side of the circuit board 7c constituting the touch pad 7, and the reflector 30 can reflect light from the light emitter 17a toward a side wall of the operation knob 20 to output the light to the front surface side of the operation knob 20. In addition, the top surface portion 20c of the operation knob 20 may be configured such that light of a light emitter 17b on the base plate 10 may be partially outputted to the outside through the interlocking shaft 32 and a shaft 20g which are formed from translucent resin. The light emitters 17a and 17b can emit light as appropriate during an operation of the operation body 6 or upon receipt of a result of an operation.

As described above, the support elastic body 23 held by the support body 21 may elastically contact the reflector 30 integrated with the touch pad 7, thereby supporting the touch pad 7 while elastically urging the touch pad 7 at all times in a direction to be pressed against the top surface portion 20c of the operation knob 20. Thus, if the operation knob 20 is tilted relative to the base member 5 (the hollow support body 11), the gap between the touch pad 7 and the top surface portion 20c of the operation knob 20 can be kept uniform, and stable output can be obtained from the touch pad 7 at approach or contact of a finger with respect to the top surface portion 20c. Thus, output from the touch pad 7 can be stabilized with the simple configuration.

Further, since the operation knob 20 may freely rotate relative to the support body 21 and the touch pad 7 may be supported by the support body 21, the operation knob 20 may slide on the front surface of the touch pad 7 during its rotation. In order to enable smooth slide, a spacer portion 20f may be formed on the back surface side of the top surface portion 20c.

For example, the spacer portion 20f may be formed on the back surface of the top surface portion 20c as two ring-shaped projections which may extend along the circumferential direction and have different diameters, and may be formed with a uniform height over its entire circumference such that the gap between the top surface portion 20c and the touch pad 7 is uniform over the entire circumference. If the spacer portion 20f is not present between the top surface portion 20c and the touch pad 7, a non-uniform minute gap Δd (air layer) may be present between the top surface portion 20c and the touch pad 7 due to warpage and waviness of the touch pad 7 and the like. Thus, for example, when the gap Δd varies due to tilt of the operation knob 20 (the top surface portion 20c) during a rotation operation, an erroneous operation may occur as if a finger input was performed. In addition, when the gap Δd varies at finger input, output corresponding to the finger position may be unstable. On the other hand, in the configuration having the spacer portion 20f (height d=0.2 mm>>Δd), even when a gap Δd is present due to warpage and waviness of the touch pad 7 and the like, a capacitance corresponding to 1/(d+Δd) may occur between the top surface portion 20c and the touch pad 7. Thus, even when the gap Δd varies depending on an operation position of a finger, the capacitance may not greatly vary. As a result, even when the top surface portion 20c is tilted during a rotation operation, there may be no possibility that an erroneous operation will occur, and output corresponding to the position of the finger can be more stabilized, which is preferable. Moreover, a protective sheet (not shown) formed from polyethylene or the like and having a surface with less frictional resistance may be provided on the front surface of the touch pad 7, in order to reduce friction on the operation knob 20.

As described above, since the spacer portion 20f is formed between the top surface portion 20c and the touch pad 7, when the operation knob 20 rotates, the operation knob 20 can smoothly slide on the front surface of the touch pad 7, and the gap between the top surface portion 20c and the touch pad 7 urged by the support elastic body 23 can be ensured stably. Thus, an input device having excellent controllability can be provided.

In the present embodiment, the spacer portion 20f may be integrally formed in the top surface portion 20c of the operation knob 20 but may be formed on the touch pad 7 side. In addition, the spacer portion may be a part independent from the operation knob 20 and the touch pad 7, and may be any part as long as it makes the gap between the top surface portion 20c and the front surface of the touch pad 7 uniform over the entire circumference.

Next, the operation body 6, the rotation detection portion 8, and the pressing detection portion 9 will be described. As shown in FIGS. 2 and 3, the operation knob 20 constituting the operation body 6 has the shaft 20g provided vertically so as to project downwardly from the back surface side of the top surface portion 20c. The touch pad 7 may have a through hole 7a through which the shaft 20g may be inserted into the space 21f. The space 21f may be formed so as to extend from the inside of the base member 5 to the inside of the hollow support body 11.

In the space 21f, the interlocking shaft 32 may be connected on an extension line from the end portion (the lower end portion in the drawing) of the shaft 20g. The shaft 20g and the interlocking shaft 32 may be connected to each other through a cam member 31, may move in the axial direction by a pressing operation of the operation body 6, and may rotate in the circumferential direction by a rotation operation of the operation body 6. The cam member 31 may include an upper shaft insertion portion 31a which may fix the shaft 20g fitted therein and a lower shaft insertion portion 31b which may fix the upper end portion of the interlocking shaft 32 fitted therein, may connect both shafts to each other, and a cam surface 31c may be provided in a peripheral surface of the cam member 31.

Figure 5:
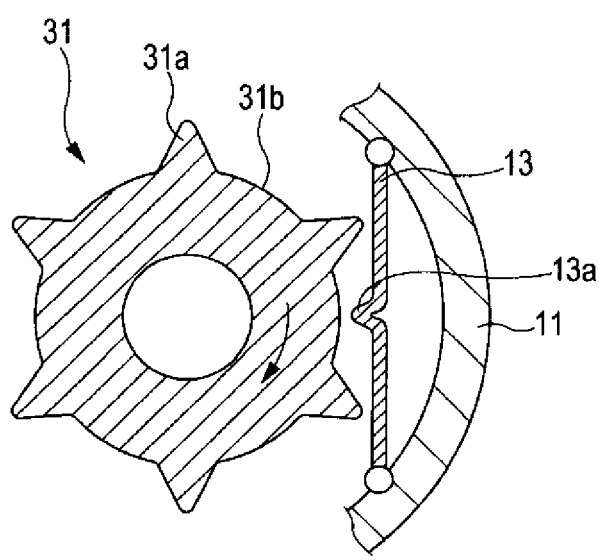
FIG. 5 is a schematic cross-sectional view of a cam member and a hollow cylindrical body.

FIG. 5 shows a schematic cross-sectional view of the cam member 31 and the hollow support body 11. As shown in FIG. 5, a cam surface 31b may be formed in the peripheral surface of the cam member 31 and has a plurality of cam projections 31a. Meanwhile, an elastic portion 13 may be provided on the inner surface of the hollow support body 11 and formed by a leaf spring. In the elastic portion 13, a leaf spring projection 13a may be formed in a bent manner at its center so as to project toward the cam member 31. When the operation knob 20 is rotated and the cam member 31 rotates, the end portion of the cam projection 31a may engage with and disengage from the leaf spring projection 13a at each predetermined angle, thereby providing a click feel for the rotation operation of the operation knob 20.

As described above, in the present embodiment, the cam projections 31a may be provided in the cam member 31 which may connect the shaft 20g to the interlocking shaft 32, and the elastic portion 13 may be provided on the base member 5 side. However, the cam projections may be provided on the base member 5 side, and the elastic portion may be provided on the shaft 20g side.

As shown in FIG. 2, a pressing movement portion 32b may be formed in the interlocking shaft 32 so as to extend vertically in the space 21f and may have a ring-shaped flat portion at its lower end. The pressing movement portion 32b may face the pressing detection portion 9 located on the base plate 10. When the operation body 6 is pressed and the shaft 20g and the interlocking shaft 32 move downwardly along the axial direction, the pressing movement portion 32b may press the pressing detection portion 9. In other words, the pressing movement portion 32b may make a detection movement for the pressing detection portion 9 with a pressing movement of the operation body 6. Thus, the pressing operation of the operation body 6 can be detected. In order to face the pressing movement portion 32b provided in the interlocking shaft 32, the pressing detection portion 9 is located on the base plate 10 and in a position facing the space 21f formed by the support body 21.

Further, as shown in FIG. 3, a cylindrical code plate 33 may be provided to the lower end portion of the interlocking shaft 32 and has a diameter larger than that of the interlocking shaft 32. The code plate 33 may have a plurality of slits 33a formed on the lower end side of a peripheral surface thereof along the circumferential direction. When the operation body 6 is rotated and the shaft 20g and the interlocking shaft 32 may rotate in the circumferential direction, its rotation position is detected by the rotation detection portion 8, and the rotation operation of the operation body 6 can be detected.

As shown in FIG. 3, for power supply and output of data, a cable 14 may be drawn from the base plate 10 and connected to the touch pad 7. The cable 14 may extend outward of the outer peripheral surface of the support body 21 and may be connected to a lower surface of the touch pad 7.

As described above, since the shaft 20g is provided in the operation knob 20 so as to extend through the through hole 7a formed in the touch pad 7 into the space 21f formed in the support body 21 and is liked to the code plate 33 and the pressing movement portion 32b in the space 21f, parts required to detect a rotation operation and a pressing operation of the operation body 6 can be located at a central portion of the input device 2. In particular, since the rotation detection portion 8 and the pressing detection portion 9 can be located so as to face the space 21f, not outside the support body 21, the size of the input device 2 in the radial direction can be reduced and size reduction of the input device 2 can be achieved.

Further, since the click mechanism formed by the cam member 31 and the elastic portion 13 can be located in the space 21f, the click mechanism can be made compact and provide a smooth click feel, and the size of the input device 2 in the radial direction can more effectively be reduced. In addition, since the connection member between the shaft 20g and the interlocking shaft 32 may be configured to serve as the click mechanism, specifically, the connection member may be formed as the cam member 31, and the entire device can be further reduced in size. Moreover, since the click mechanism can be provided at a position different from the bearing portion 22 which is a rotation support portion for the operation knob 20, it is unnecessary to receive a rotation load at the shaft 20g, and hence the shaft 20g can be formed with a small diameter and the through hole 7a formed in the touch pad 7 can be made small. Thus, performance deterioration caused by forming a hole in the touch pad 7 can be prevented.

Further, regarding the support body 21 and the operation knob 20 constituting the operation body 6, the bearing portion 22, which allows the inner ring portion 22b fixed to the support body 21 and the outer ring portion 22a fixed to the operation knob 20 to freely rotate relative to each other, may allow the operation knob 20 to freely rotate along the peripheral surface of the support body 21, whereby an operation of the operation knob 20 can assuredly and smoothly be performed without backlash.

Although the embodiments of the present disclosure have been described above, the application of the present disclosure is not limited to the embodiments and may be variously applied within the scope of the technical idea thereof.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. An input device comprising:
a base member including a hollow support body; and
an operation body supported so as to freely rotate relative to the hollow support body and freely reciprocate along a direction of a rotational axis, the operation body including an operation knob formed in a cylindrical shape and having a top surface portion and a plate-shaped touch pad provided on a back side of the top surface portion for detecting approach or contact of a finger with respect to the top surface portion, wherein
the base member has a space formed so as to extend from an inside of the base member to an inside of the hollow support body,
the operation knob has a shaft provided vertically so as to extend from a back surface of the top surface portion,
the touch pad has a through hole through which the shaft is inserted into the space,
a rotation detection portion for detecting a rotating movement of the operation body and a pressing detection portion for detecting a reciprocating movement of the operation body are provided,
in the space, the shaft is linked to a rotating movement portion which makes a rotation detection movement for the rotation detection portion with a rotating movement of the operation body, and the shaft is linked to a pressing movement portion which makes a pressing detection movement for the pressing detection portion with a reciprocating movement of the operation body,
an interlocking shaft is located in the space and connected to the shaft and configured to serve as a click mechanism,
the rotating movement portion and the pressing movement portion are provided in the interlocking shaft,
the shaft and the interlocking shaft are connected to each other through a cam portion having a plurality of cam surfaces formed along a peripheral surface thereof, and
an elastic portion is provided in the hollow support body and engages with and disengages from the cam surfaces with a rotating movement of the operation body.

2. The input device according to claim 1, wherein the rotation detection portion and the pressing detection portion are located so as to face the space.

3. The input device according to claim 1, wherein
the operation body includes a support body which rotationally supports the operation knob, and
the support body is supported by the hollow support body so as to reciprocate along a direction of a rotational axis of the operation knob.

4. The input device according to claim 3, wherein the support body and the operation knob are freely rotatable along a peripheral surface of the support body by a bearing portion which includes an inner ring portion fixed to the support body and an outer ring portion fixed to the operation knob, the inner ring portion and the outer ring portion freely rotating relative to each other.

* * * * *